United States Patent
Morzano

(10) Patent No.: US 10,443,531 B2
(45) Date of Patent: Oct. 15, 2019

(54) APPARATUSES AND METHODS FOR STORING REDUNDANCY REPAIR INFORMATION FOR MEMORIES

(71) Applicant: MICRON TECHNOLOGY, INC., Boise, ID (US)

(72) Inventor: Christopher Morzano, Boise, ID (US)

(73) Assignee: Micron Technology, Inc., Boise, ID (US)

(*) Notice: Subject to any disclaimer, the term of this patent is extended or adjusted under 35 U.S.C. 154(b) by 150 days.

(21) Appl. No.: 15/681,143

(22) Filed: Aug. 18, 2017

(65) Prior Publication Data

US 2019/0055895 A1    Feb. 21, 2019

(51) Int. Cl.
*G11C 29/00* (2006.01)
*F02D 41/24* (2006.01)
*G11C 29/02* (2006.01)
*G06F 12/06* (2006.01)
(Continued)

(52) U.S. Cl.
CPC ....... *F02D 41/249* (2013.01); *G06F 12/0653* (2013.01); *G11C 29/027* (2013.01); *G11C 29/787* (2013.01); *G11C 17/16* (2013.01); *G11C 2029/4402* (2013.01)

(58) Field of Classification Search
CPC .. F02D 41/249; G11C 29/027; G06F 12/0653
See application file for complete search history.

(56) References Cited

U.S. PATENT DOCUMENTS

| | | |
|---|---|---|
| 5,430,679 A | 7/1995 | Hiltebeitel et al. |
| 6,036,101 A | 3/2000 | Bolan et al. |
| 6,211,710 B1 | 4/2001 | Madhu et al. |

(Continued)

FOREIGN PATENT DOCUMENTS

| | | |
|---|---|---|
| TW | I478313 B | 3/2015 |
| TW | 201542260 A | 11/2015 |

(Continued)

OTHER PUBLICATIONS

U.S. Appl. No. 15/493,772, entitled: "Apparatuses and Methods for Flexible Fuse Transmission", filed Apr. 21, 2017.

(Continued)

*Primary Examiner* — Samir W Rizk
(74) *Attorney, Agent, or Firm* — Dorsey & Whitney LLP

(57) ABSTRACT

Apparatuses and methods for storing redundancy repair information for memories are disclosed. An example apparatus includes a fuse array, a repair plane, and a decode logic and control circuit. The fuse array stores repair information that includes repair commands and load repair addresses. The load repair addresses include a respective repair address. The repair plane includes a block of memory and repair logic. The block of memory includes a plurality of redundant memory and the repair logic includes a plurality of repair blocks. Each repair block is associated with a respective one of the plurality of redundant memory and each repair block of the plurality of repair blocks stores a repair address. The decode logic and control circuit reads the repair information and decodes the repair commands, and loads repair addresses into the plurality of repair blocks based at least in part on the decoded repair commands.

15 Claims, 9 Drawing Sheets

(51) Int. Cl.
*G11C 17/16* (2006.01)
*G11C 29/44* (2006.01)

(56) References Cited

U.S. PATENT DOCUMENTS

| | | | |
|---|---|---|---|
| 6,262,923 | B1 | 7/2001 | Fujita |
| 6,697,289 | B1 | 2/2004 | Yamamoto |
| 7,215,586 | B2 | 5/2007 | Martin et al. |
| 9,666,307 | B1 | 5/2017 | Fujiwara et al. |
| 9,824,770 | B1 | 11/2017 | Fujiwara et al. |
| 10,056,154 | B2 | 8/2018 | Fujiwara et al. |
| 2002/0141264 | A1 | 10/2002 | Mori et al. |
| 2002/0167855 | A1 | 11/2002 | Hsu et al. |
| 2004/0004510 | A1 | 1/2004 | Lehmann |
| 2004/0019763 | A1 | 1/2004 | Lakhani et al. |
| 2004/0085814 | A1 | 5/2004 | Kawai et al. |
| 2004/0190357 | A1 | 9/2004 | Scheuerlein et al. |
| 2005/0046002 | A1 | 3/2005 | Lee et al. |
| 2007/0047343 | A1* | 3/2007 | Adams ............... G11C 29/802 365/200 |
| 2007/0268760 | A1 | 11/2007 | Iwai |
| 2008/0270828 | A1 | 10/2008 | Wienchol |
| 2008/0284037 | A1 | 11/2008 | Andry et al. |
| 2009/0204847 | A1 | 8/2009 | Lakhani et al. |
| 2011/0280091 | A1* | 11/2011 | Rooney ............... G11C 17/18 365/200 |
| 2013/0083612 | A1 | 4/2013 | Son et al. |
| 2013/0223171 | A1 | 8/2013 | Kim et al. |
| 2013/0235644 | A1 | 9/2013 | Chung |
| 2013/0258748 | A1 | 10/2013 | Kim et al. |
| 2013/0322183 | A1 | 12/2013 | Jeong |
| 2014/0241085 | A1 | 8/2014 | Ryu et al. |
| 2014/0369143 | A1 | 12/2014 | Eichmeyer |
| 2015/0135038 | A1 | 5/2015 | Wilson et al. |
| 2015/0179237 | A1 | 6/2015 | Jeong |
| 2018/0075920 | A1 | 3/2018 | Fujiwara et al. |
| 2019/0057758 | A1 | 2/2019 | Morzano et al. |

FOREIGN PATENT DOCUMENTS

| | | |
|---|---|---|
| WO | 2018052596 A1 | 3/2018 |
| WO | 2019036229 A1 | 2/2019 |

OTHER PUBLICATIONS

U.S. Appl. No. 15/681,183, entitled "Apparatuses and Methods for Latching Redundancy Repair Addresses at a Memory", filed Aug. 18, 2017.

U.S. Appl. No. 15/668,586, entitled "Apparatuses and Methods for Flexible Fuse Transmission" filed Aug. 3, 2017.

U.S. Appl. No. 16/407,029, titled "Apparatuses and Methods for Storing Redundancy Repair Information for Memories" filed May 8, 2019.

* cited by examiner

APPARATUSES AND METHODS FOR STORING REDUNDANCY REPAIR INFORMATION FOR MEMORIES

BACKGROUND

High data reliability, high speed of memory access, lower power consumption and reduced chip size are features that are demanded from semiconductor memory. One way of achieving high data reliability is by introducing fuse arrays including a plurality of fuse sets and a plurality of redundancy decoders corresponding to the plurality of fuse sets to provide substitute rows/columns of memory cells for defective rows/columns of cells in a memory array. The addresses for defective memory of the array may be mapped to redundant memory, thereby repairing the memory location for the address. Each fuse set may store an address of a defective cell (Defective Address). Each redundant address decoder receives row/column address signals and compares the received row/column address signals to the defective addresses stored in the fuses. If the received row/column address signals correspond with a defective address stored in any fuse, access to the received row/column address is disabled and the redundant row/column address may be accessed instead. Defective addresses may be obtained by a plurality of tests that may be performed during manufacture of the semiconductor memory.

As the density of memory has increased for semiconductor memory, additional redundant memory is needed to maintain yield of fully functioning memories. The additional redundant memory requires larger fuse arrays with a greater number of fuses to store potentially more addresses. The larger the fuse array, the more area is consumed on a semiconductor die by the fuse arrays and associated programming logic, high current and high power bussing, and fuse addressing circuity. Therefore, there is a desire for reducing the size of the fuse array and the associated circuits while maintaining the repairability of larger memory density semiconductor memory.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
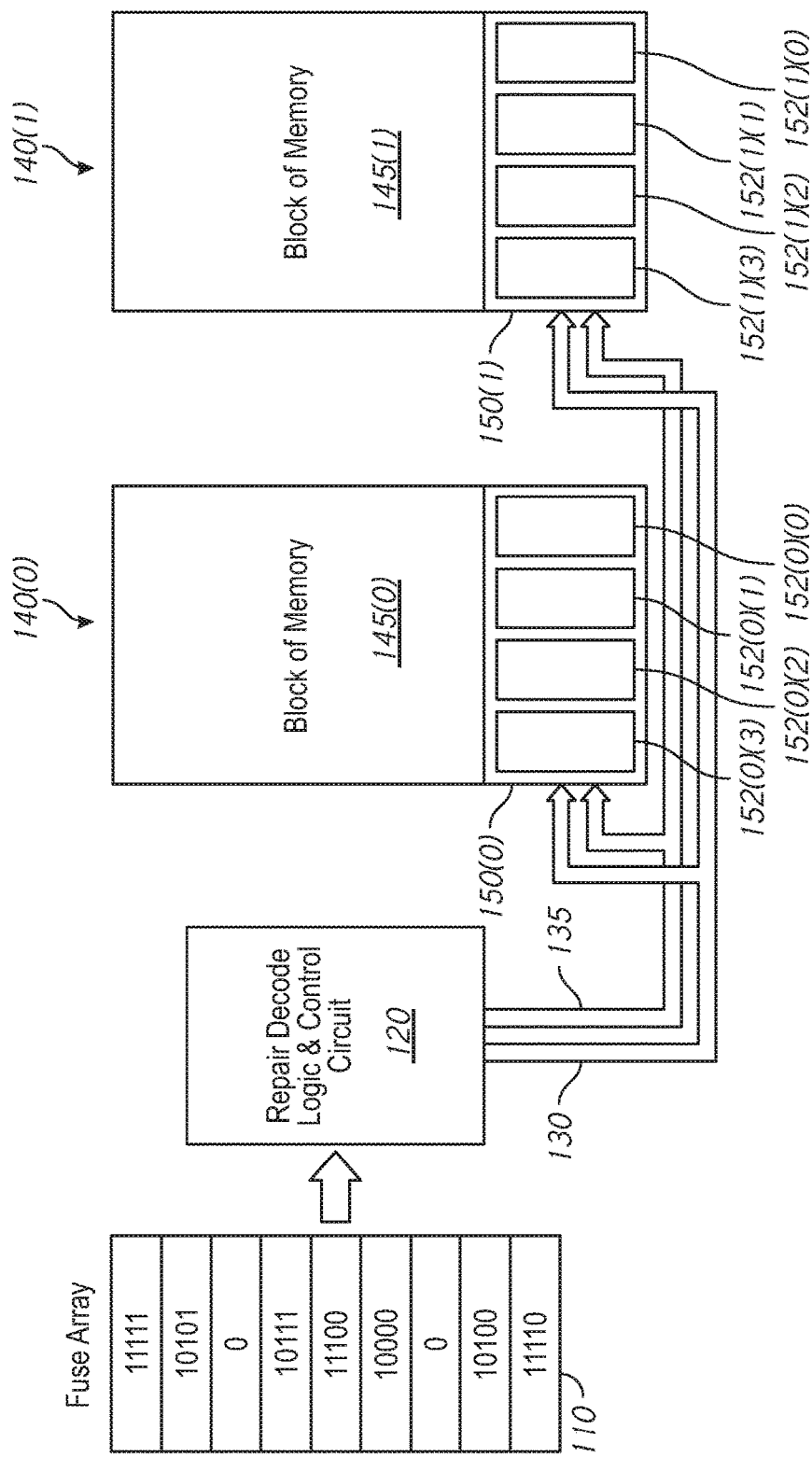
FIG. 1A is a block diagram of a memory repair system according to an embodiment of the disclosure.

FIG. 1A is a block diagram of a memory repair system 100 according to an embodiment of the disclosure. The memory repair system 100 includes a fuse array 110 in which repair information may be programmed and stored. The fuse array 110 includes antifuse elements. An antifuse element is an element which is insulated in an initial state and, when subjected to dielectric breakdown by a connect operation, makes a transition to a conductive state. When the transition to the conductive state is once made by the connect operation, the antifuse element cannot be returned again to the insulated state. Therefore, the antifuse element can be used as a nonvolatile and irreversible storage element. The connect operation with respect to the antifuse element uses a high potential VPPSV and a negative potential VBBSV. The high potential VPPSV and the negative potential VBBSV is generated by a power-source circuit 30 based on a power-source potential VDD and a ground potential VSS. The antifuse elements of the fuse array 110 may be programmed using conventional antifuse programming circuits.

The repair information programmed and stored in the fuse array 110 may be used when initializing a semiconductor device to setup the memory locations that are repaired by redundant memory included in a memory array. The memory repair system 100 further includes a repair decode logic and control circuit 120, and repair planes 140(0) and 140(1). Each of the repair planes 140 includes a respective block of memory 145 and repair logic 150. The blocks of memory 145 each include a plurality of rows, a plurality of columns, and a plurality of memory cells arranged at intersections of the plurality of the rows and columns.

The block of memory 145 includes primary memory and redundant memory that is limited to repairing primary memory of the associated block of memory 145. The redundant memory includes redundant memory units that may be used to repair primary memory of the same block of memory. The repair units may include redundant row units that are used to repair defective memory along the rows and may further include redundant column units that are used to repair defective memory along the columns. The repair is accomplished by remapping a memory address for a primary memory location in the block of memory to a redundant memory unit, thus repairing a defective primary memory location, as will be described in more detail below. In the embodiment of the disclosure of FIG. 1A, two repair planes 140(0) and 140(1) are shown. However, in other embodiments, there may be more than two repair planes. Thus, the number of repair planes may be changed without departing from the scope of the present disclosure.

The repair decode logic and control circuit 120 reads the repair information from the fuse array 110 and provides control signals and repair addresses to the repair logic 150 of repair planes 140(0) and 140(1). The repair addresses are provided by the repair decode logic and control circuit 120 over repair address lines 130 and the control signals are provided by the repair decode logic and control circuit 120 over signal lines 135. The repair addresses may be loaded into repair blocks 152 of the repair logic 150. Each repair block 152 is associated with a respective redundant memory unit of the redundant memory. The repair address loaded into a repair block 152 will be mapped to the respective redundant memory unit so that the respective redundant memory unit is accessed instead of the primary memory associated with the repair address, thereby "repairing" the associated primary memory.

The repair logic 150 of FIG. 1A is illustrated as including four repair blocks 152, which corresponds to repairing up to four memory addresses with four redundant memory units. It will be appreciated, however, that the number of repair blocks and corresponding redundant memory units that are included in a repair plane 140 may be greater of fewer than shown in FIG. 1A without departing from the scope of the disclosure.

As previously described, repair blocks corresponding to the redundant memory are loaded with the addresses of memory locations that are to be repaired by the redundant memory. Incoming memory addresses are compared with the addresses loaded in the repair blocks, and if the incoming address matches a loaded address, the associated redundant memory unit is accessed instead of the original primary memory location for the incoming address. The memory array and redundant memory are divided into repair planes, with each repair plane having a block of memory. The block of memory includes primary memory and redundant memory that are limited to repairing the primary memory of the associated block of memory. The redundant memory for a repair plane includes one or more redundant memory units that may be used to repair the memory of the associated block of memory. The redundant memory units may include redundant rows of memory for repairing defective rows of memory of the associated block of memory and may further or alternatively include redundant columns of memory for repairing defective columns of memory of the associated block of memory.

Figure 2A:
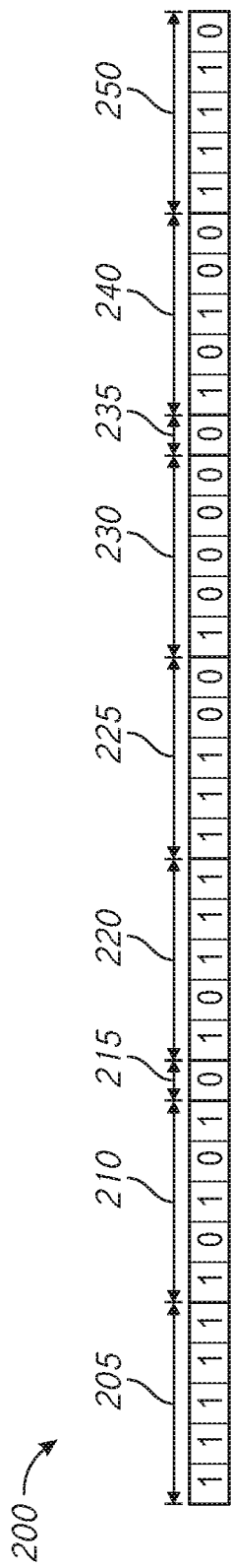
FIG. 2A is a diagram of example repair information according to an embodiment of the disclosure.

FIG. 2A is a diagram of example repair information 200 according to an embodiment of the disclosure. The repair information 200 may be programmed in a fuse array to store the repair information. The repair information may be used when initializing a semiconductor device to setup the memory locations that are repaired by redundant memory, for example, the fuse array 110 of FIG. 1A. As will be described in more detail below, the repair information 200 may include, for example, repair commands and repair addresses. A repair decode logic and control circuit decodes the commands and provides control signals and repair addresses to perform the command and load the repair addresses to be repaired by redundant memory. The repair commands may include various commands, for example, resetting a repair plane token to a first repair plane, loading an address to be repaired, end loading of addresses for a current repair plane and transfer the repair plane token to a next repair plane, end loading of any addresses because repair address loading is complete, as well as other commands. As will be described in more detail below, the repair plane token may be used to keep track of which repair plane repair addresses are being The repair information 200 may be an example for repairing rows of memory of a memory array using redundant rows of memory in each of the repair planes. The repair information 200 may also be an example for repairing columns of memory of a memory array using redundant columns of memory in each of the repair planes.

The repair information 200 includes repair commands 205, 225 and 250 and load repair addresses 210, 215, 220, 230, 235, and 240. In the embodiment of the disclosure illustrated by FIG. 2A, the repair commands are identified by a prefix of "11" and load repair addresses are identified by a prefix of "10" or simply "0." In the example repair information 200, the repair commands further include three bits of a command code following the repair command prefix and the load repair addresses further include three bits of a repair address following the load repair address prefix. It will be appreciated, however, that the prefixes, the command codes, and the repair addresses may include a greater or fewer number of bits without departing from the scope of the disclosure.

The repair command 205 is a command that causes the repair decode logic and control circuit to reset a repair plane token to the first repair plane. As will be described in more detail below, the repair plane token is used to identify to which repair plane repair addresses are to be loaded. The load repair address 210 causes the repair decode logic and control circuit to load a valid repair flag "1" and load the repair address "101" into an available repair block for the repair plane currently having possession of the repair plane token (i.e., loaded into a first repair block for the first repair plane). As a result, the valid repair flag "1" indicates that the repair address loaded into the repair block is valid, and the associated redundant memory unit will be used to repair address "101." The repair flag "1" and the repair address "101" may be referred to as a repair address and repair flag set.

The load repair address 215 causes the repair decode logic and control circuit to load all zeros (i.e., an invalid repair flag "0" and all remaining bits are zeros) in a next available repair block in the repair plane currently having possession of the repair plane token (e.g., loaded into a second repair block for the first repair plane). The loading of all zeros in a repair block caused by the load repair address 215 effectively causes the repair block to be skipped. A repair block may be skipped because the associated redundant memory unit is defective, for example. The load repair address 215 of the repair information 200 includes one zero bit, and results in the skipping of a repair block by loading an invalid repair flag "0" and "0" bits for the repair address, which in FIG. 2A are shown to include three bits. Thus, in the embodiment of the disclosure illustrated by FIG. 2A, the one zero bit that is stored, for example, by a fuse array, results in four bits loaded into a repair block. In comparison to an approach that stores several bits to load a repair block with all zeros, the embodiment of the disclosure of FIG. 2A requires fewer antifuses to be programmed in the fuse array. The embodiment of the disclosure of FIG. 2A stores at least some of repair addresses in a compressed format (e.g., storing one "0" in the fuse array to load multiple zeros). That is, the number of bits of information stored in the fuse array is less than the corresponding repair address that is loaded into a repair block. The repair addresses in the compressed format are read by the repair decode logic and control circuit and uncompressed to load a repair block with all zeros, for example. The compressed format of the repair addresses may result in using fewer antifuses for programming repair information. Using fewer antifuses for programming repair information may reduce the number of antifuses that may need to be included in a fuse array to provide sufficient repairability to a semiconductor device.

The load repair address 220 causes the repair decode logic and control circuit to load a valid repair flag "1" and load the repair address "111" into an available repair block for the repair plane currently having possession of the repair plane token (e.g., loaded into a third repair block for the first repair plane).

The repair command 225 is a repair command that causes the repair decode logic and control circuit to transfer the repair plane token to a next repair plane (e.g., a second repair plane in the present example). The transfer of the repair plane token causes following load repair addresses to load the repair addresses into repair blocks of the repair plane having the repair plane token. As a result, the load repair address 230 causes the repair decode logic and control circuit to load a valid repair flag "1" and load the repair address "000" into an available repair block for the next repair plane (e.g., loaded into a first repair block for the second repair plane). The load repair address 235 causes the repair decode logic and control circuit to load all zeros in a next available repair block in the same repair plane (e.g., loaded into a second repair block for the second repair plane) to cause the repair block to be skipped. The load repair address 240 causes the repair decode logic and control circuit to load a valid repair flag "1" and load the repair address "100" into an available repair block for the same repair plane (e.g., loaded into a third repair block for the second repair plane).

The repair command 250 is a command that indicates an end of the repair address loading for a type of memory (e.g., end of the repair address loading for rows of memory, end of the repair address loading for columns of memory).

Figure 2B:
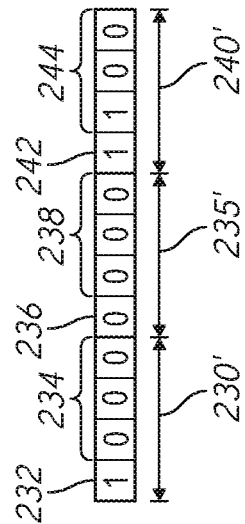
FIGS. 2B and 2C are diagrams of example repair address and repair flag sets for the FIG. 2A according to an embodiment of the disclosure.
Figure 2C:

FIGS. 2B and 2C are diagrams of example repair address and repair flag sets according to an embodiment of the disclosure. FIG. 2B shows the repair address and repair flag sets for a first repair plane based on the repair information 200 of FIG. 2A. FIG. 2C shows the repair address and repair flag set for a second repair plane based on the repair information 200 of FIG. 2A. The repair address and repair flag sets are representative of information that may be loaded into repair blocks of the repair planes. The order and arrangement of the repair address and repair flag in a repair address and repair flag set is provided by way of example, and is not intended to limit the scope of the disclosure to the specific examples of FIGS. 2B and 2C.

FIG. 2B shows three repair address and repair flag sets 210', 215', and 220'. The repair address and repair flag sets 210', 215', and 220' correspond to the load repair addresses 210, 215, and 220. As previously described, the load repair address 210 causes the repair decode logic and control circuit to load a valid repair flag "1" and load the repair address "101" into an available repair block for a first repair plane. The repair address and repair flag set 210' includes a one bit valid repair flag "1" 212 and a three bit repair address "101" 214. The load repair address 215 causes the repair decode logic and control circuit to load all zeros into a next available repair block. The repair address and repair flag set 215' includes a one bit invalid repair flag "0" 216 and three bit "000" 218. The load repair address 220 causes the repair decode logic and control circuit to load a valid repair flag "1" and load the repair address "111" into a next available repair block for the first repair plane. The repair address and repair flag set 220' includes a one bit valid repair flag "1" 222 and a three bit repair address "111" 224.

With reference to the repair information 200 of FIG. 2A, and as previously described, the repair command 225 fol-lowing the load repair address 220 causes the repair decode logic and control circuit to transfer the repair plane token to the second repair plane, thus signaling the completion of loading repair address and repair flag sets for the first repair plane. In this manner, any remaining repair blocks for the first repair plane can remain vacant and it is unnecessary to load information or provide separate commands to skip over each of the remaining repair blocks for the first repair plane.

FIG. 2C shows three repair address and repair flag sets 230', 235', and 240'. The repair address and repair flag sets 230', 235', and 240' correspond to the load repair addresses 230, 235, and 240. As previously described, the load repair address 230 causes the repair decode logic and control circuit to load a valid repair flag "1" and load the repair address "000" into an available repair block for a second repair plane. The repair address and repair flag set 230' includes a one bit valid repair flag "1" 232 and a three bit repair address "000" 234. The load repair address 235 causes the repair decode logic and control circuit to load all zeros into a next available repair block for the second repair plane. The repair address and repair flag set 235' includes a one bit invalid repair flag "0" 236 and three bit "000" 238. The load repair address 240 causes the repair decode logic and control circuit to load a valid repair flag "1" and load the repair address "100" into a next available repair block for the second repair plane. The repair address and repair flag set 240' includes a one bit valid repair flag "1" 242 and a three bit repair address "100" 244.

As illustrated by the repair address and repair flag sets of FIGS. 2B and 2C, the load repair addresses 215 and 235 are uncompressed by the decode logic and control circuit from the one "0" bit of the compressed repair address into four "0" bits of an uncompressed repair address.

With reference to the repair information 200 of FIG. 2A, and as previously described, the repair command 250 indicates an end of the repair address loading for a type of memory (e.g., end of the repair address loading for rows of memory, end of the repair address loading for columns of memory). As with the repair command 225, the remaining repair blocks for the second repair plane remain vacant and it is unnecessary to load information or provide separate commands to skip over each of the remaining repair blocks for the second repair plane.

Operation with the repair information 200 will be described with reference to FIGS. 1A, 1B, and 1C and FIGS. 2A, 2B, and 2C.

Figure 1B:
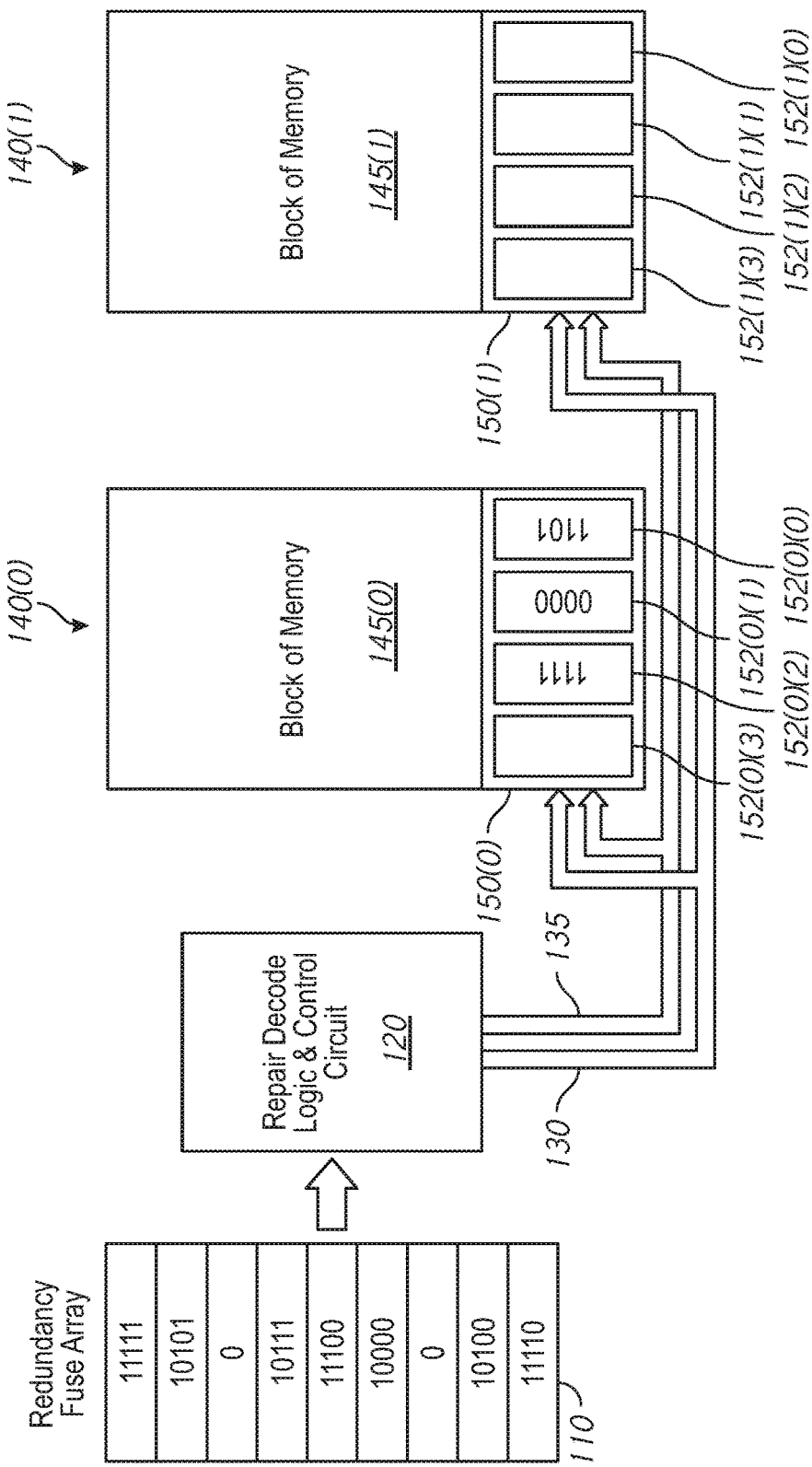
FIGS. 1B and 1C are block diagrams of the memory repair system of FIG. 1A for an example repair according to an embodiment of the disclosure.

The repair command 205 is read and decoded by the repair decode logic and control circuit 120 to reset a repair plane token to the repair plane 140(0). Following the reset of the repair plane token, the load repair address 210 is read by the repair decode logic and control circuit 120 and translated into the repair address and repair flag set 210'. The resulting repair address and repair flag set 210' is loaded into the repair block 152(0)(0) because the load repair address 210 is the first repair address following the reset of the repair plane token to the repair plane 140(0). The load repair address 215 is read next by the repair decode logic and control circuit 120 and translated into the repair address and repair flag set 215'. As previously described, the "0" of the load repair address 215 results in all zeros being loaded, as illustrated by the repair address and repair flag set 215'. The repair address and repair flag set 215' is loaded into the repair block 152(0)(1) because the repair block 152(0)(1) is the next available repair block (i.e., the repair block 152(0)(0) is already loaded with the repair address and repair flag set 210'). The load repair address 220 is read next by the repair decode logic and control circuit 120 and translated into the repair address and repair flag set 220'. The resulting repair address and repair flag set 220' is loaded into the repair block 152(0)(2) because the repair block 152(0)(2) is the next available repair block (i.e., the repair block 152(0)(1) is already loaded with the repair address and repair flag set 215'). FIG. 1B shows the repair address and repair flag sets 210', 215', and 220' loaded into the repair blocks 152(0)(0), 152(0)(1), and 152(0)(2), respectively.

Following the load repair address 220 being read from the fuse array 110, the repair decode logic and control circuit 120 reads and decodes the repair command 225 and transfers the repair plane token from the repair plane 140(0) to the repair plane 140(1). As a result, the repair block 152(0)(3) remains vacant and any subsequent load repair addresses read by the repair decode logic and control circuit 120 will be loaded into the repair blocks 152 of the repair plane 140(1). In this manner, repair blocks of a repair plane 140 may remain unused if it is not necessary to repair any other memory locations in the primary memory 145. As will be described in more detail below, the unused repair blocks of a repair plane may be used at a later time to repair primary memory if it is determined that additional memory repair is needed. For example, a memory location found to be defective after the manufacture of the semiconductor device 100, such as when an in-field defect is determined may be repaired by using the repair block 152(0)(3). The address of the newly detective memory location may be loaded into the vacant repair block(s) 352 to repair the newly defective memory location.

Figure 1C:
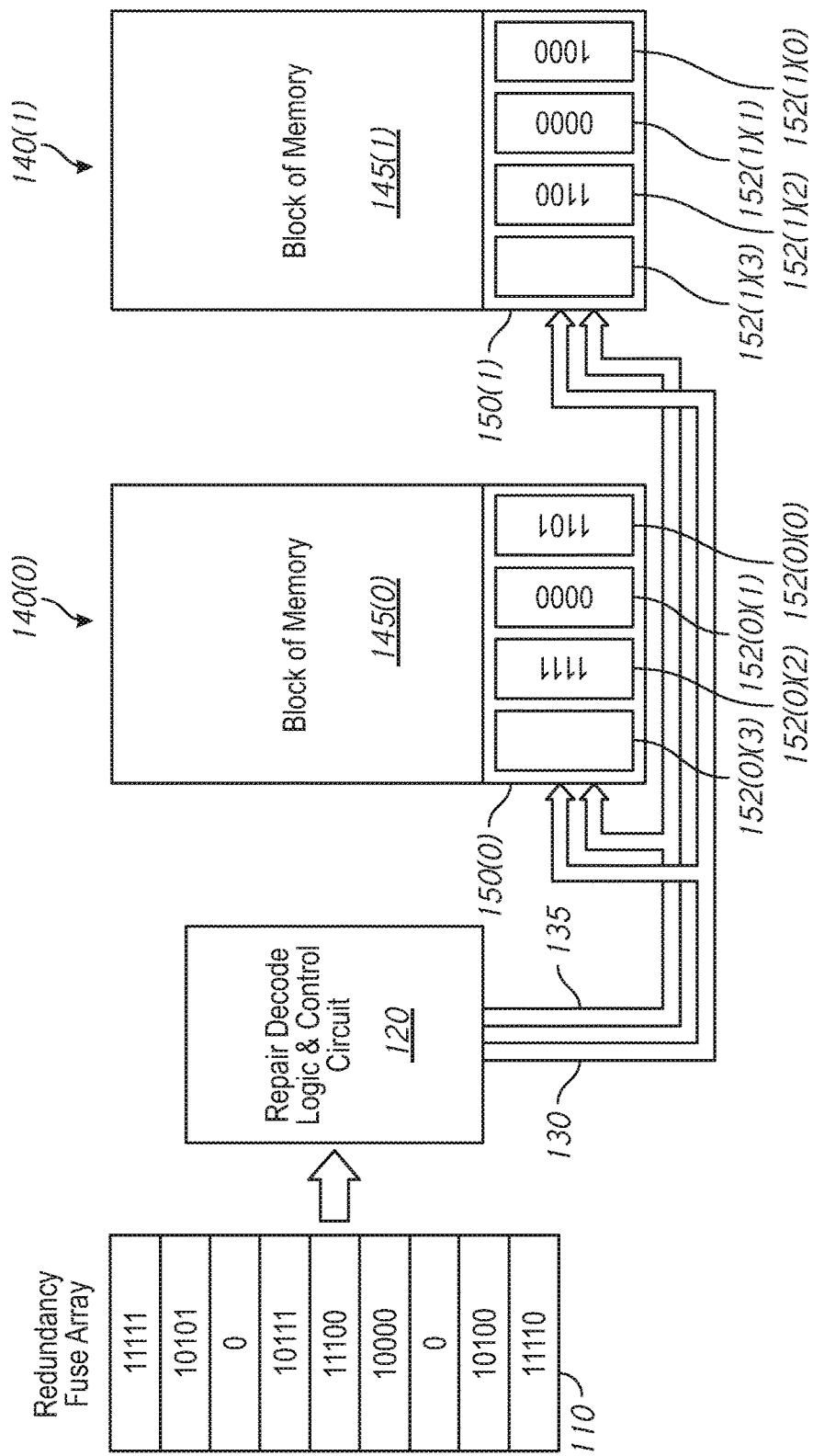

As previously described, any load repair addresses will now be loaded into the repair blocks 152 of the repair plane 140(1) because the repair token has been transferred to the repair plane 140(1). For example, the load repair address 230 is read and translated by the repair decode logic and control circuit 120 into the repair address and repair flag set 230'. The resulting repair address and repair flag set 230' is loaded into the repair block 152(1)(0) because the load repair address 230 is the first repair address following the transfer of the repair plane token to the repair plane 140(1). The load repair address 235 is read next by the repair decode logic and control circuit 120 and translated into the repair address and repair flag set 235'. As previously described, the "0" of the load repair address 235 results in all zeros being loaded, as illustrated by the all zero repair address and repair flag set 235'. The repair address and repair flag set 235' is loaded into the repair block 152(1)(1) because the repair block 152(1)(1) is the next available repair block (i.e., the repair block 152(1)(0) is already loaded with the repair address and repair flag set 210'). The load repair address 240 is read next by the repair decode logic and control circuit 120 and translated into the repair address and repair flag set 240'. The resulting repair address and repair flag set 240' is loaded into the repair block 152(1)(2) because the repair block 152(1)(2) is the next available repair block (i.e., the repair block 152(1)(1) is already loaded with the repair address and repair flag set 235'). FIG. 1C shows the repair address and repair flag sets 230', 235', and 240' loaded into the repair blocks 152(1)(0), 152(1)(1), and 152(1)(2), respectively.

The repair decode logic and control circuit 120 reads the repair command 250 from the fuse array 110, which indicates an end of the repair address loading for a type of memory (e.g., end of the repair address loading for rows of memory, end of the repair address loading for columns of memory). As with vacant repair blocks of a repair plane 140(0), vacant repair blocks of the repair plane 140(1) (e.g., repair block 152(1) in the example) may remain unused if additional repair of any other memory locations in the primary memory 145 is unnecessary. The unused repair blocks of the repair plane 140(1) may be used at a later time if it is determined that additional memory repair is needed to repair primary memory 145(1) of the repair plane 140(1).

Figures 3A, 3B:
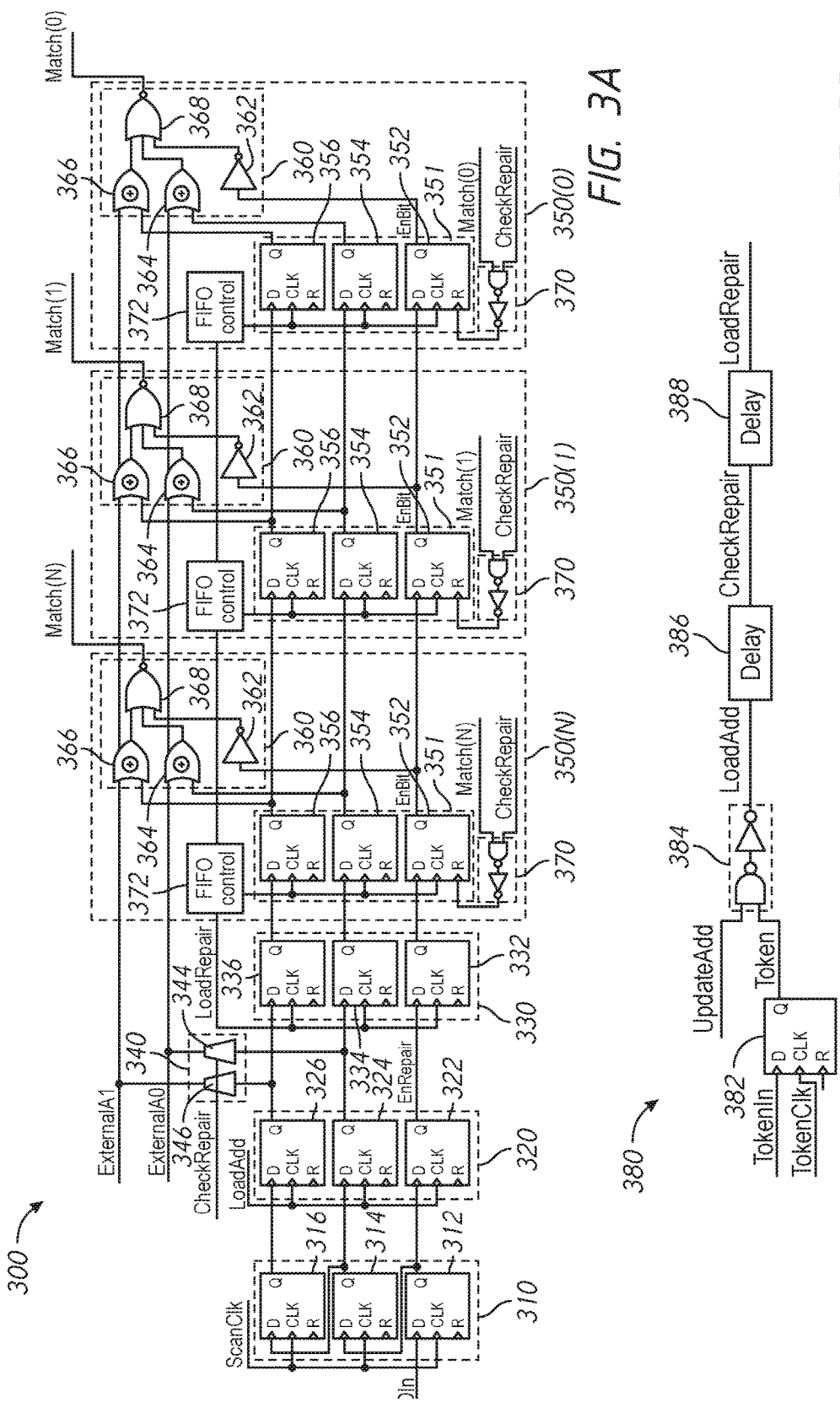
FIG. 3A is a schematic diagram of repair logic for a repair plane according to an embodiment of the disclosure.
FIG. 3B is a schematic diagram of control and timing circuit according to an embodiment of the disclosure.

FIG. 3A is a schematic diagram of repair logic 300 for a repair plane according to an embodiment of the disclosure. The repair logic 300 includes an input circuit 310, a preload circuit 320, and a load circuit 330. The repair logic 300 further includes a repair switch circuit 340 and repair blocks 350(0)-350(N). The repair logic 300 includes circuits for operation with two-bit repair addresses. It will be appreciated that the example of repair logic 300 for two-bit repair addresses is not intended to limit the scope of the disclosure to the specific embodiment, but is meant to provide an example that may be applied to repair addresses having a fewer or greater number of bits than described for the specific embodiment. Thus, the scope of the disclosure is not limited to the specific embodiment of the repair logic 300 of FIG. 3A.

The input circuit 310 includes FF circuits 312, 314, and 316. The FF circuits are coupled in series so that an output of the FF circuit 312 is provided to a data input of the FF circuit 314, and an output of the FF circuit 314 is provided to a data input of the FF circuit 316. The FF circuit 312 is provided repair information at a data input. As a ScanClk signal clocks, the bits of the repair information are serially shifted into the FF circuits 312, 314, and 316.

The preload circuit 320 includes FF circuits 322, 324, and 326. Each of the FF circuits 322, 324, and 326 receives at a respective data input the output of one of the TT circuits 312, 314, and 316. The FF circuits 322, 324, and 326 latch the bit applied to the respective data input responsive to a LoadAdd signal. The LoadAdd signal becomes active to cause the FF circuits 322, 324, and 326 to latch the bit after three rising edges of the ScanClk signal, in effect latching in parallel three bits that were serially shifted into the FF circuits 312, 314, and 316 of the input circuit 310.

The load circuit 330 includes FF circuits 332, 334, 336. Each of the FF circuits 332, 334, and 336 receives at a respective data input the output of one of the FF circuits 322, 324, and 326. The FF circuits 332, 334, and 336 latch the bit applied to the respective data input responsive to a LoadRepair signal. The LoadRepair signal becomes active to cause the FF circuits 332, 334, and 336 to latch the respective bit from the FF circuits 322, 324, and 326 of the preload circuit 320. After latching, the three bits are provided by the FF circuits 332, 334, and 336 to the repair block 350(N) and shifted through the repair blocks (toward the repair block 350(0)) to an available repair block.

The repair logic 300 includes repair blocks 350(0)-350(N). Each repair block 350 is associated with a respective redundant memory unit. When a valid repair address is loaded into a repair block, the address is mapped to the associated redundant memory unit. A repair block 350 includes a latch group 351 that includes FF circuits 352, 354, and 356. The latch group 351 stores a two bit repair address in FF circuits 354 and 356, and stores a one bit repair flag in FF circuit 352. The repair block 350 further includes an address comparison circuit 360. The address comparison circuit 360 compares an address received on address lines to a repair address stored by the FF circuits 354 and 356 of the latch group 351. The address comparison circuit 360 provides and active match signal Match when the received address matches the stored repair address. The address comparison circuit 360 includes OR logic circuits 364 and 366, and a NOR logic circuit 368. The NOR logic circuit 368 receives the outputs of the OR logic circuits 364 and 366, and further receives an output of an inverter circuit 362, which receives the repair flag as the EnBit signal from the FF circuit 352.

The repair block 350 further includes a reset circuit 370 that includes a NAND logic circuit and an inverter circuit. The reset circuit 370 provides a reset signal to reset input of the FF circuit 352 to reset the FF circuit. The FF circuit 352 is reset when the reset signal is active. The reset signal is active when a CheckRepair signal is active (e.g., active logic high level) and there is a match between a received address and the respective repair address stored by FF circuits 354 and 356. A FIFO control circuit 372 receives the LoadRepair signal and controls the clocking of the FF circuits 352, 354, and 356 of the latch group 351. The FIFO control circuits 372 clock the FF circuits of a respective latch group 351 to shift a repair address and repair flag through the repair blocks starting from repair block 350(N) toward repair block 350(0) until the repair address and repair flag are latched by a next available repair block. In this manner, the repair addresses and repair flags are loaded into the repair blocks 350, with a first repair address and repair flag loaded into repair block 350(0), a second repair address and repair flag loaded into repair block 350(1), a third repair address and repair flag loaded into repair block 350(2), and so on.

The repair switch circuit 340 includes pass gates 344 and 346. The repair switch 340 provides repair address bits from the FF circuits 324 and 326 to respective address lines responsive to an active CheckRepair signal (e.g., active high logic level). The repair switch circuit 340 is activated to compare a repair address currently latched in the preload circuit 320 with repair addresses stored in the repair blocks 350.

The comparison of a repair address in the preload circuit 320 may be relevant when loading repair addresses of memory locations that are determined to be defective after an initial determination of defective memory locations. For example, defective memory locations may be initially determined during the manufacture of the semiconductor device. In the event a memory location is determined to be defective after the manufacture of the semiconductor device, such as when an in-field defect is determined, the address of the newly defective memory location may be loaded into a vacant repair block 350 to repair the newly defective memory location.

The comparison of a repair address for a newly defective memory location prior to being loaded from the preload circuit 320 to the load circuit 330 may be used to determine if the newly defective memory location is a memory location that has already been repaired. In such a case, one of the repair blocks 350 already loaded with the same address would indicate a match when compared with the address of the newly defective memory location. A match may indicate that the redundant memory unit used to originally repair the memory location has become defective, and as such, the now defective redundant memory unit should be skipped and repaired by another redundant memory unit, if available. The now defective redundant memory is skipped by resetting the FF circuits to zero for the latch group 351 in the repair block 350 that indicated a match. The FF circuit 352 is reset to zero by the reset circuit 370 when the match signal and the CheckRepair signal are active.

FIG. 3B is a schematic diagram of control and timing circuit 380 according to an embodiment of the disclosure. The control and timing circuit 380 may be used to provide the control and timing signals for the repair logic 300. The control and timing circuit 380 includes a FF circuit 382 that receives a TokenIn signal at a data input and a TokenClk signal at a clock input, and provides a Token signal to a logic circuit 384. The logic circuit 384 includes a NAND logic circuit and an inverter. The logic circuit 384 provides the TokeIn signal as the LoadAdd signal responsive to an active UpdateAdd signal. The LoadAdd signal is provided to a delay circuit 386, which provides a CheckRepair signal having a delay relative to the LoadAdd signal. The CheckRepair signal is provided to the delay circuit 388, which provides a LoadRepair signal having a delay relative to the CheckRepair signal. As will be described in more detail below, the LoadAdd, CheckRepair, and LoadRepair signals are provided to the repair logic 300 for operation.

Figure 4:
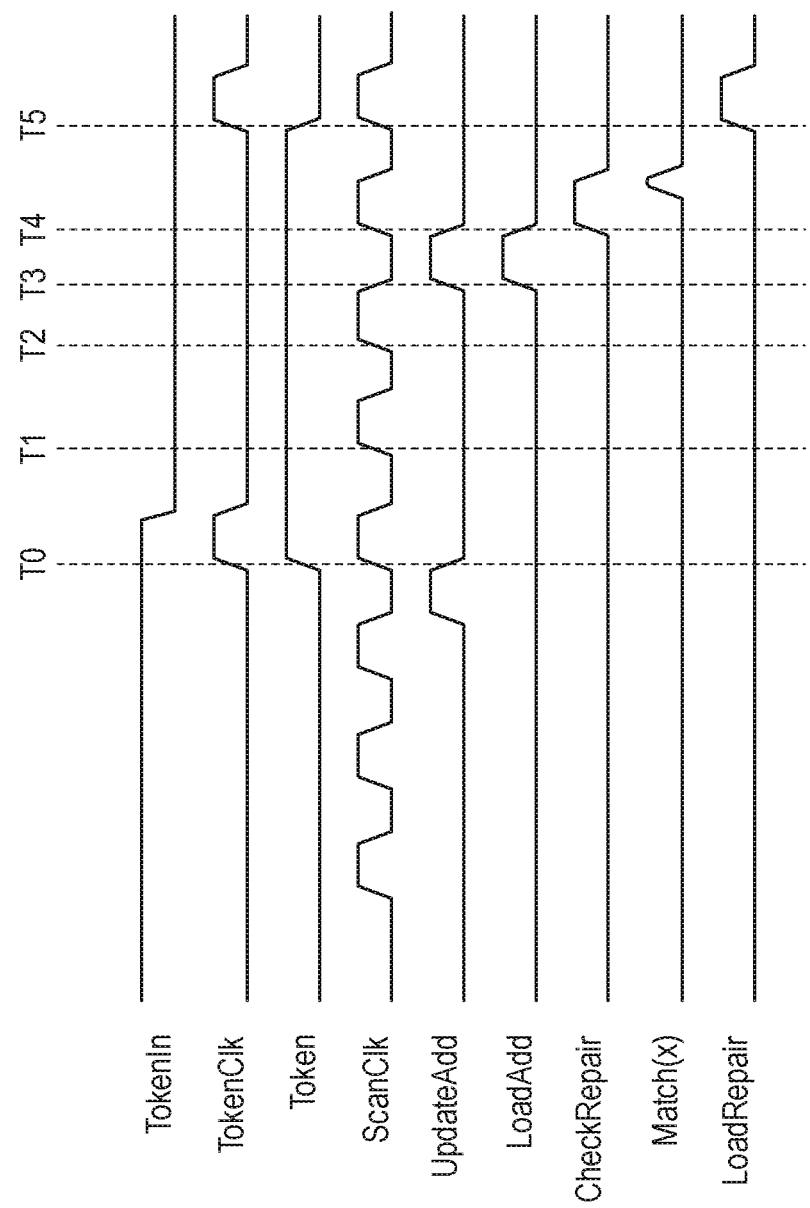
FIG. 4 is a timing diagram of various signals during operation of the repair logic and the control and timing circuit according to an embodiment of the disclosure.

Operation of the repair logic 300 and the control and timing circuit 380 will be described with reference to FIGS. 3A, 3B, and 4. FIG. 4 is a timing diagram of various signals during operation of the repair logic 300 and the control and timing circuit 380 according to an embodiment of the disclosure.

At time T0, a rising edge of the TokenClk clocks the FF circuit 382 of the control and timing circuit 380 to latch the high logic level of the TokenIn signal provided to the data input of the FF circuit 382. The FF circuit 382 provides a high logic level Token signal in response to the latching of the TokenIn signal. The TokenIn signal is at a high logic level and the TokenClk signal is active when a repair command causes the repair decode logic and control circuit to reset the repair plane token or causes a repair plane token to be transferred to a next repair plane.

At times T0-T2, the rising edges of the ScanClk signal clock the FF circuits 312, 314, and 316 of the input circuit 310 to latch and shift in three bits of repair information. The repair information may be read from a fuse array and provided to the input circuit 310 serially. The bit of repair information latched by the FF circuit 312 at time T0 is a second bit of the repair address A1. The bit of repair information latched by the FF circuit 312 at time T1 is a first bit of the repair address A0. Also at time T1, the second bit of the repair address A1 is latched by the FF circuit 312. The bit of repair information latched by the FF circuit 312 at time 12 is the repair flag for the repair address. Also at time T2, the second bit A1 of the repair address is latched by the FF circuit 314, and the first bit A0 of the repair address bit is latched by the FF circuit 312. Thus, following time 12, three bits of repair information are latched in the input circuit 310.

At time T3, the UpdateAdd signal becomes active and is provided by the logic circuit 384 as an active LoadAdd signal, which causes the FF circuits 322, 324, and 326 of the preload circuit 320 to latch the three bits of repair information from the input circuit 310. The FF circuit 322 latches the repair flag, the FF circuit 324 latches the first bit of the repair address A0, and the FF circuit 326 latches the second bit of the repair address A1. Thus, following time 13, the repair flag and repair address bits A0 and A1 of the repair address are loaded in the preload circuit 320.

The active LoadAdd signal at time T3 results in an active CheckRepair signal at time T4, which is provided by the delay circuit 386. The active CheckRepair signal activates the repair switch circuit 340 to compare the repair address bits A0 and A1 latched in the preload circuit 320 with repair addresses stored in the repair blocks 350. Assuming that none of the repair blocks 350 indicate a match, the match signals all remain inactive (e.g., a low logic level) causing the reset circuit 370 to provide a low logic level signal to a reset input of the FF circuit 352 of the latch groups 351 of the repair blocks 350. As a result, none of the FF circuits of the latch groups 351 are reset to zero. However, if one of the repair blocks 350 indicates a match, the respective match signal becomes active and causes the reset circuits 370 of the repair blocks 350 that have indicated a match to reset the FF circuits of the latch groups to zero. As a result, the redundant memory units associated with the repair blocks 350 having the FF circuits reset to zero are effectively disabled from use.

Regardless of whether the repair address in the preload circuit 320 matches a repair address stored by the latch group of a repair block 350, the repair flag and the repair address bits A0 and A1 are loaded into the load circuit 330 at time T5 by activation of the LoadRepair signal. The LoadRepair signal has a delay relative to the CheckRepair signal provided by the delay circuit 388. The active LoadRepair signal also causes the FIFO control circuit 372 of the repair blocks 350(N)-(0) to clock the FF circuits of the respective latch groups 351. The clocking of the latch groups 351 advance the repair flag and the repair address bits A0 and A1 through the repair blocks 350 towards 350(0) until the repair flag and repair address bits A0 and A1 are loaded into the latch group 351 of a next available repair block 350. After the repair block into which the repair flag and repair address bits A0 and A1 are loaded, the FIFO control circuit 372 will no longer clock the FF circuits 352, 354, and 356 of the latch group 351 to preserve the latched repair flag and repair address bits A0 and A1.

Around time T5, the TokenClk signal is activated again, which represents that the repair plane token is transferred to a next repair plane. The activated TokenClk signal causes the FF circuit 382 to latch the low logic level of the TokenIn signal. As a result, the Token signal provided by the FF circuit 382 becomes a low logic level. The low logic level of the Token signal causes the logic circuit 384 to provide a constant low logic level LoadAdd signal, thereby ceasing any further loading of new repair flags and repair addresses into the preload circuit 320. After the repair plane token is transferred to another repair plane, any unused repair blocks 350 remain unused.

As previously discussed, at time T3 the repair flag and the repair address bits A0 and A1 are loaded into the preload circuit 320 from the FF circuits 312, 314, and 316 responsive to the LoadAdd signal becoming active. The activation of the LoadAdd signal at time T3 is approximately concurrent with a falling edge of the ScanClk signal. In an example where the repair plane token is not transferred to another repair plane by the activation of the TokenClk at time T5, as the ScanClk signal continues to clock following time T3, bits of a next repair flag and repair address are latched and shifted into the FF circuits 312, 314, and 316 of the input circuit 310. The next repair flag and repair address are then loaded into the FF circuits 322, 324, and 326 of the preload circuit 320 responsive to a next active LoadAdd signal. The repair flag and repair address are then loaded into a next available repair block 350 through the load circuit 330. More generally, the latching and shifting of bits of new repair flags and repair addresses into the input circuit 310 to then be loaded into the repair blocks 350 through the preload circuit 320 and load circuit 330 continues until the repair plane token is transferred to another repair plane, for example, responsive to a repair command.

Figure 5:
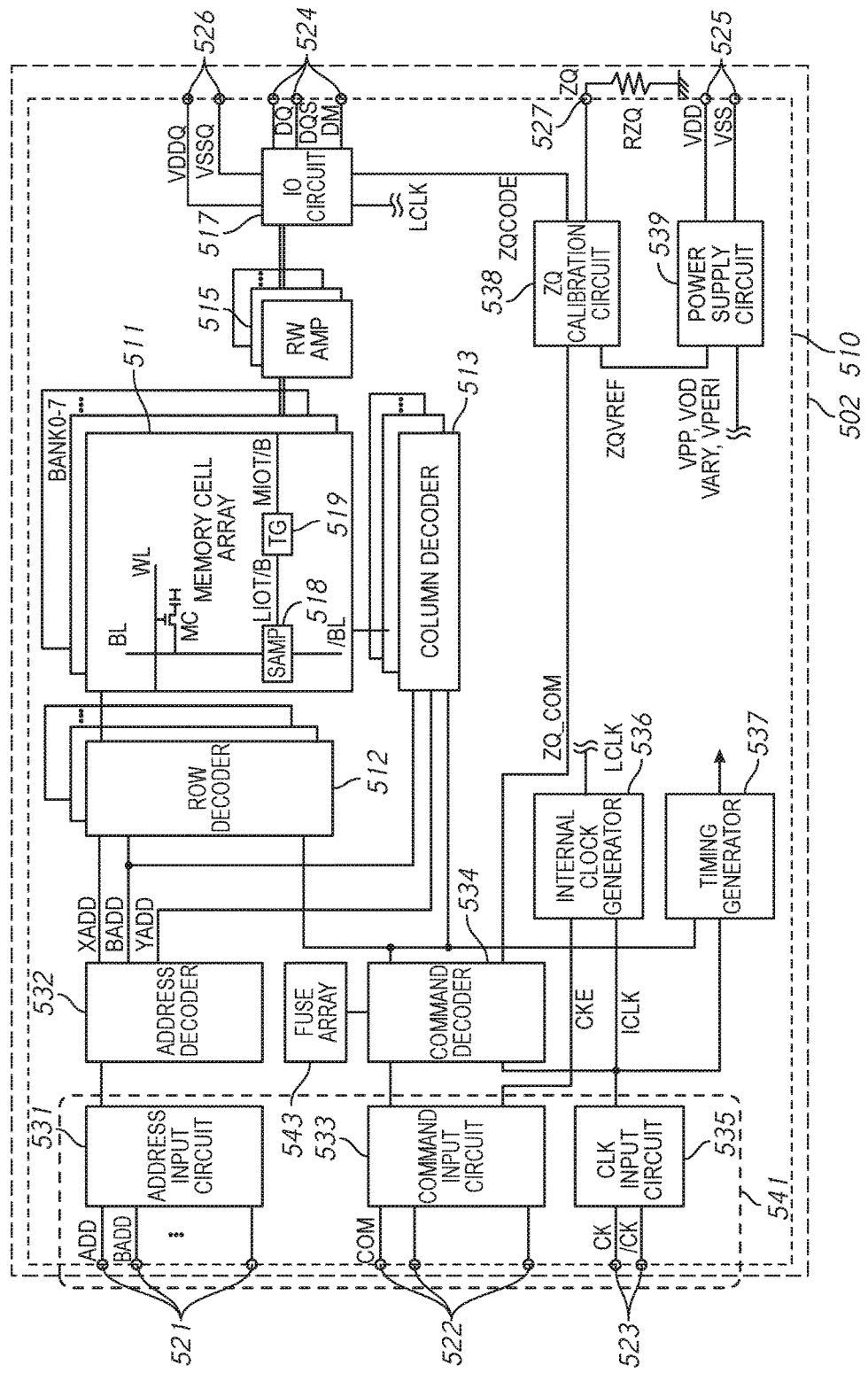
FIG. 5 is a block diagram of a semiconductor device in accordance with an embodiment of the present disclosure.

FIG. 5 is a block diagram of a semiconductor device in accordance with an embodiment of the present disclosure. The semiconductor device 510 may include a memory repair system according to an embodiment of the disclosure. For example, in an embodiment of the disclosure, the semiconductor device 510 includes a memory repair system 100 of FIG. 1A.

The semiconductor device 510 may be a memory device integrated into a single semiconductor chip, for example. The semiconductor device 510 may be mounted on an external substrate 502 that is a memory module substrate, a mother board or the like. The semiconductor device 510 may include various circuits, including memory circuits, as will be described in more detail below. As shown in FIG. 5, the semiconductor device 510 includes a memory cell array 511. The memory cell array 511 includes a plurality of banks, each bank including a plurality of word lines WI, a plurality of bit lines BL, and a plurality of memory cells MC arranged at intersections of the plurality of word lines WL and the plurality of bit lines BL. The selection of the word line WL is performed by a row decoder 512 and the selection of the bit line BL is performed by a column decoder 513. Sense amplifiers 518 are coupled to corresponding bit lines BL and connected to local I/O line pairs LIOT/B. Local 10 line pairs LIOT/B are connected to main IO line pairs MIOT/B via transfer gates TG 519 which function as switches. The memory cell array 511 includes repair planes according to an embodiment of the disclosure. Defective memory of the memory cell array 511 may be repaired using the repair planes.

Turning to the explanation of a plurality of external terminals included in the semiconductor device 510, the plurality of external terminals includes address terminals 521, command terminals 522, clock terminals 523, data terminals 524, power supply terminals 525 and 526, and the calibration terminal ZQ 527. An input signal block 541 may include the address terminals 521, the command terminals 522 and the clock terminals 523. A data interface block 542 includes the data terminals 524. The data terminals 524 may be coupled to output buffers for read operations of memories. Alternatively, the data terminals 524 may be coupled to input buffers for read/write access of the memories that will be later described. FIG. 5 shows an example of dynamic random access memory (DRAM), however, any device having external terminals for signal input/output may be included as the external terminals of embodiments of the present disclosure.

The address terminals 521 are supplied with an address signal ADD and a bank address signal BADD. The address signal ADD and the bank address signal BADD supplied to the address terminals 521 are transferred via an address input circuit 531 to an address decoder 532. The address decoder 532 receives the address signal ADD and supplies a decoded row address signal XADD to the row decoder 512, and a decoded column address signal YADD to the column decoder 513. The address decoder 532 also receives the bank address signal BADD and supplies the bank address signal BADD to the row decoder 512 and the column decoder 513.

The command terminals 522 are supplied with a command signal COM. The command signal COM may include one or more separate signals. The command signal COM input to the command terminals 521 is input to a command decoder 534 via the command input circuit 533. The command decoder 534 decodes the command signal COM to generate various internal command signals. For example, the internal commands may include a row command signal to select a word line and a column command signal, such as a read command or a write command, to select a hit line, and a calibration signal ZQ_COM provided to the ZQ calibration circuit 538.

Accordingly, when a read command is issued and a row address and a column address are timely supplied with the read command, read data is read from a memory cell MC in the memory cell array 511 designated by these row address and column address. The read data DQ is output externally from the data terminals 524 via a read/write amplifier 515 and an input/output circuit 517. Similarly, when the write command is issued and a row address and a column address are timely supplied with the write command, and then write data DQ is supplied to the data terminals 524, the write data DQ is supplied via the input/output circuit 517 and the read/write amplifier 515 to the memory cell array 511 and written in the memory cell MC designated by the row address and the column address. The input/output circuit 517 may include input buffers, according to one embodiment.

The clock terminals 523 are supplied with external clock signals CK and /CK, respectively. These external clock signals CK and /CK are complementary to each other and are supplied to a clock input circuit 535. The clock input circuit 35 receives the external clock signals CK and /CK and generates an internal clock signal ICLK. The internal clock signal ICLK is supplied to an internal clock generator 536 and thus a phase controlled internal clock signal LCLK is generated based on the received internal clock signal ICLK and a clock enable signal CKE from the command input circuit 533. Although not limited thereto, a DLL circuit can be used as the internal clock generator 536. The phase controlled internal clock signal LCLK is supplied to the input/output circuit 517 and is used as a timing signal for determining an output timing of the read data DQ. The internal clock signal ICLK is also supplied to a timing generator 537 and thus various internal clock signals can be generated.

The semiconductor device 510 further includes a fuse array 543 including a plurality of antifuse elements) that may be programmed with repair information as previously described. The command decoder 534 may include a repair decode logic and control circuit according to an embodiment of the disclosure to read the repair information from the fuse array 543 and load repair addresses into repair blocks to repair defective memory locations of the memory cell array 511.

The power supply terminals 525 are supplied with power supply voltages VDD and VSS. These power supply voltages VDD and VSS are supplied to an internal power supply circuit 539. The internal power supply circuit 539 generates various internal voltages VPP, VOD, VARY, VPERI, and the like and a reference voltage ZQVREF based on the power supply voltages VDD and VSS. The internal voltage VPP is mainly used in the row decoder 512, the internal voltages VOD and VARY are mainly used in the sense amplifiers 18 included in the memory cell array 511, and the internal voltage VPERI is used in many other circuit blocks. The reference voltage ZQVREF is used in the ZQ calibration circuit 538.

The power supply terminals 526 are supplied with power supply voltages VDDQ and VSSQ. These power supply voltages VDDQ and VSSQ are supplied to the input/output circuit 517. The power supply voltages VDDQ and VSSQ may be the same voltages as the power supply voltages VDD and VSS that are supplied to the power supply terminals 525, respectively. However, the dedicated power supply voltages VDDQ and VSSQ may be used for the input/output circuit 517 so that power supply noise generated by the input/output circuit 517 does not propagate to the other circuit blocks.

The calibration terminal ZQ is connected to the calibration circuit 538. The calibration circuit 538 performs a calibration operation with reference to an impedance of an external resistor RZQ and the reference voltage ZQVREF, when activated by the calibration signal ZQ_COM. The external resistor RZQ that is connected to a calibration terminal ZQ 27 of the semiconductor device 10. The external resistor RZQ is a reference impedance of a ZQ calibration circuit 538. In the present embodiment, the external resistor RZQ is coupled to ground. An impedance code ZQCODE obtained by calibration operation is supplied to the input/output circuit 517, and thus an impedance of an output buffer (not shown) included in the input/output circuit 517 is specified.

Figure 6A:
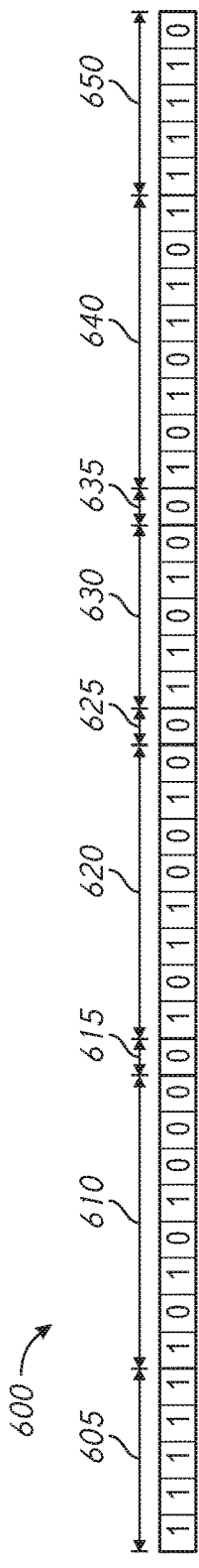
FIG. 6A is a diagram of example repair information according to an embodiment of the disclosure.

FIG. 6A is a diagram of example repair information 600 according to an embodiment of the disclosure. The repair information 600 may be programmed in a fuse array to store the repair information. The repair information may be used when initializing the semiconductor device to setup the memory locations that are repaired by redundant memory. The repair information 600 includes repair commands and repair addresses. A repair decode logic and control circuit decodes the commands and provides control signals and repair addresses to perform the command and load the repair addresses to be repaired by redundant memory. In contrast to the repair information 200 of FIG. 2A, the repair information 600 may be first translated into intermediate repair information before being loaded into latch groups of repair planes. For example, the repair commands and repair addresses of the repair information 600 may be changed into a different format or removed before being loaded into latch groups of repair planes. Additionally, whereas the repair information 200 of FIG. 2A includes three bit repair addresses, the repair information 600 includes six bit repair addresses. However, the repair information 600 includes two bit prefixes and three bit command codes similarly to the repair information 200.

The repair information 600 includes repair commands 605, 630, and 650, and load repair addresses 610, 615, 620, 625, 635, and 640. In the embodiment of the disclosure illustrated by FIG. 6A, the repair commands are identified by a prefix of "11" and load repair addresses are identified by a prefix of "10" or simply "0." In the example repair information 600, the repair commands further include three bits of a command code following the repair command prefix and the load repair addresses further include six bits of a repair address following the load repair address prefix. It will be appreciated, however, that the prefixes, the command codes, and the repair addresses may include a greater or fewer number of bits without departing from the scope of the disclosure.

The repair command 605 is a command that causes the repair decode logic and control circuit to reset a repair plane token to the first repair plane. The load repair address 610 causes the repair decode logic and control circuit to load a valid repair flag "1" and load the repair address "101000" into an available latch group for the repair plane currently having possession of the repair plane token (i.e., loaded into a first latch group for the first repair plane). The load repair address 615 causes the repair decode logic and control circuit to load all zeros (i.e., an invalid repair flag "0" and all remaining bits are zeros) in a next available latch group in the repair plane currently having possession of the repair plane token (e.g., loaded into a second latch group for the first repair plane). The load repair address 620 causes the repair decode logic and control circuit to load a valid repair flag "1" and load the repair address "110010" into an available latch group for the repair plane currently having possession of the repair plane token (e.g., loaded into a third latch group for the first repair plane). The load repair address 625 causes the repair decode logic and control circuit to load all zeros into a next available latch group in the repair plane currently having possession of the repair plane token (e.g., loaded into a fourth latch group for the first repair plane).

As previously described with reference to the repair information 200 of FIG. 2A, the loading of all zeros in a latch group caused by a load repair address, for example, load repair address 615 and 625, effectively causes the repair block and the associated redundant memory unit to be skipped. The load repair address 615 and 625 include one zero bit, and results in the skipping of a latch group by loading an invalid repair flag "0" and "0" bits for the repair address, which in FIG. 6A are shown to include six bits. Thus, in the embodiment of the disclosure illustrated by FIG. 6A, the one zero bit that is stored, for example, by a fuse array, results in seven bits loaded into a latch group. In comparison to an approach that stores several bits to load a latch group with all zeros, the embodiment of the disclosure of FIG. 6A requires fewer antifuses to be programmed in the fuse array. The embodiment of the disclosure of FIG. 6A stores at least some of repair addresses in a compressed format (e.g., storing one "0" in the fuse array to load multiple zeros). That is, the number of bits of information stored in the fuse array is less than the corresponding repair address that is loaded into a repair block. The repair addresses in the compressed format are read by the repair decode logic and control circuit and uncompressed to load a repair block with all zeros, for example. The compressed format of the repair addresses may result in using fewer antifuses for programming repair information. Using fewer antifuses for programming repair information may reduce the number of antifuses that may need to be included in a fuse array to provide sufficient repairability to a semiconductor device.

The repair command 630 is a command to transfer the repair plane token to a next repair plane (e.g., a second repair plane in the present example). As a result, the load repair address 635 causes the repair decode logic and control circuit to load all zeros into an available latch group in the next repair plane (e.g., loaded into a first latch group for the second repair plane). The load repair address 640 causes the repair decode logic and control circuit to load a valid repair flag "1" and load the repair address "101101" into an available latch group for the same repair plane (e.g., loaded into a second latch group for the second repair plane).

The repair command 650 is a command that indicates an end of the repair address loading for a type of memory (e.g., end of all of the repairs for rows of memory, end of all of the repairs for columns of memory).

Figure 6B:
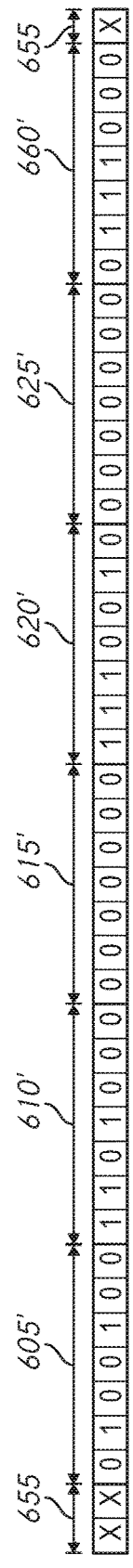
FIGS. 6B and 6C are diagrams of example intermediate repair information based on the repair information of FIG. 6A according to an embodiment of the disclosure.
Figure 6C:
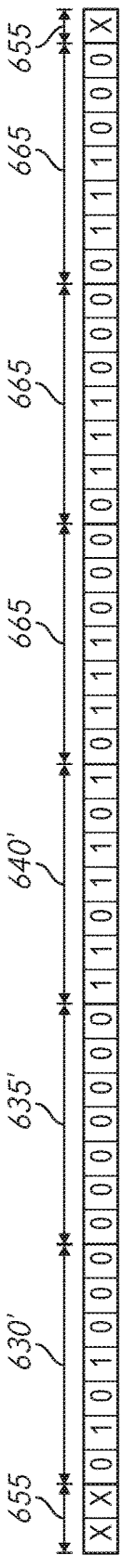

As previously described, the repair information 600 may be first translated into intermediate repair information before being loaded into latch groups of repair planes. FIGS. 6B and 6C are diagrams of example intermediate repair information based on the repair information 600 according to an embodiment of the disclosure. FIG. 6B shows a first repair information chain and FIG. 6C shows a second repair information chain based on the repair information 600 of FIG. 6A. The intermediate repair information includes control commands and repair address and repair flag sets. The intermediate repair information of FIGS. 6B and 6C may be provided over a communication channel. As such, the first and second repair information chains may include a set number of bits to meet the protocol of the communication channel. In an embodiment of the disclosure, the intermediate repair information of FIGS. 6B and 6C is provided over a Joint Test Action Group (JTAG) communication channel, with the first and second repair information chains of FIGS. 6B and 6C meeting the protocol for a HAG communication channel. The intermediate repair information may be provided to a semiconductor device including a JTAG port and JTAG communication circuits. The JTAG communication circuits included in the semiconductor device may receive the intermediate repair information and provide the intermediate repair information to repair address and repair flag loading circuits including in the semiconductor device. The repair address and repair flag loading circuits load the repair address and repair flag sets into repair blocks based on the control commands.

The first repair information chain of FIG. 6B includes retime bits 655 which are used by the communication circuits receiving the information to synchronize the reading of the bits of the first repair information chain. Following the leading pair of retime bits 655, the first repair information chain includes control command 605', which is the translation of the repair command 605 of the repair information 600 by the repair decode logic and control circuit. That is, the repair command of "11111" of the repair command 605 is translated into the control command "0100100" 605' of the intermediate repair information. Following the control command 605' is a repair address and repair flag set 610'. The repair address and repair flag set 610' corresponds to the load repair address 610 of the repair information 600. The first bit of the repair address and repair flag set 610' is a repair flag of "1" indicating that the repair address is valid, and the following six bits "101000" is the repair address to be repaired. The repair address and repair flag set 610' is loaded into a repair block by repair address and repair flag loading circuits in the semiconductor device. The repair address and repair flag set 615' following the repair address and repair flag set 610' corresponds to the load repair address 615 of the repair information 600. As previously described, the single zero of the load repair address 615 results in all zeros to be loaded into a repair block. The repair address and repair flag set 615' includes one bit invalid repair flag "0" and a six bit "000000", which results in the repair block into which the all zero repair address and repair flag set to be skipped.

Following the repair address and repair flag set 615' are repair address and repair flag sets 620' and 625', which correspond to load repair addresses 620 and 625, respectively. The repair address and repair flag set 620' includes a repair flag of "1" and a six bit repair address of "110010," which will be loaded into a next available repair block and will be repaired by a redundant memory unit associated with the repair block. The repair address and repair flag set 625' includes a one bit invalid repair flag "0" and a six bit "000000", which results in the repair block into which the all zero repair address and repair flag set is loaded to be skipped. The first repair chain of FIG. 6B further includes a control command 660 following the repair address and repair flag set 625'. The control command 660 is included to fill in the remainder of the first repair information chain of FIG. 6B before the retime bit 655. The control command 660 is essentially a no-operation command that causes the repair address and repair flag loading circuits of the semiconductor device to do nothing. The intermediate repair information chain of FIG. 6B includes 42 bits of control commands and repair address and repair flag sets, and an additional two bits for the leading retiming bits 655 and an addition one bit for the retiming bit 655 for a total length of 45 bits.

The second repair information chain of FIG. 6C includes leading retire bits 655 which are followed by control command 630'. The control command 630' is the translation of the repair command 630 of the repair information 600 by the repair decode logic and control circuit. The repair command of "11010" of the repair command 630 is translated into the control command "0101000" 630' of the intermediate repair information. As previously described, the repair command 630 commands the transfer of the repair plane token to a next repair plane (e.g., a second repair plane). The resulting the control command 630' causes the repair address and repair flag loading circuits of the semiconductor device to load any subsequent repair address and repair flag sets into the repair blocks of the second repair plane. Thus, the repair address and repair flag set 635' that corresponds to the single zero bit of the load repair address 635 of the repair information 600 will be loaded into an available repair block of the second repair plane. Given that the repair address and repair flag set 635' includes one bit invalid repair flag "0" and a six bit "000000", the repair block of the second repair plane into which the all zero repair address and repair flag set is loaded to be skipped.

Following the repair address and repair flag set 635' is the repair address and repair flag set 640', which corresponds to the load repair addresses 635 of the repair information 600. The repair address and repair flag set 635' includes a repair flag of "1" and a six bit repair address of "101101," which will be loaded into a next available repair block and will be repaired by a redundant memory unit associated with the repair block. The second repair chain of FIG. 6C further includes control commands 665 following the repair address and repair flag set 640'. The control commands 665 result from the repair command 650 of the repair information 600. As previously described, the repair command. 650 indicates the end of the repair address loading for a type of memory. The control commands 665 indicate the same, and are repeated as many times necessary to complete the second repair information chain of FIG. 6C. As with the intermediate repair information chain of FIG. 6B, the intermediate repair information chain of FIG. 6C includes 42 bits of control commands and repair address and repair flag sets, and an additional two bits for the leading retiming bits 655 and an addition one bit for the retiming bit 655 for a total length of 45 bits.

As illustrated by the repair address and repair flag sets of FIGS. 6B and 6C, the load repair addresses 615, 625, and 635 are uncompressed by the decode logic and control circuit from the one "0" bit of the compressed repair address into six "0" bits of an uncompressed repair address.

Figure 7:
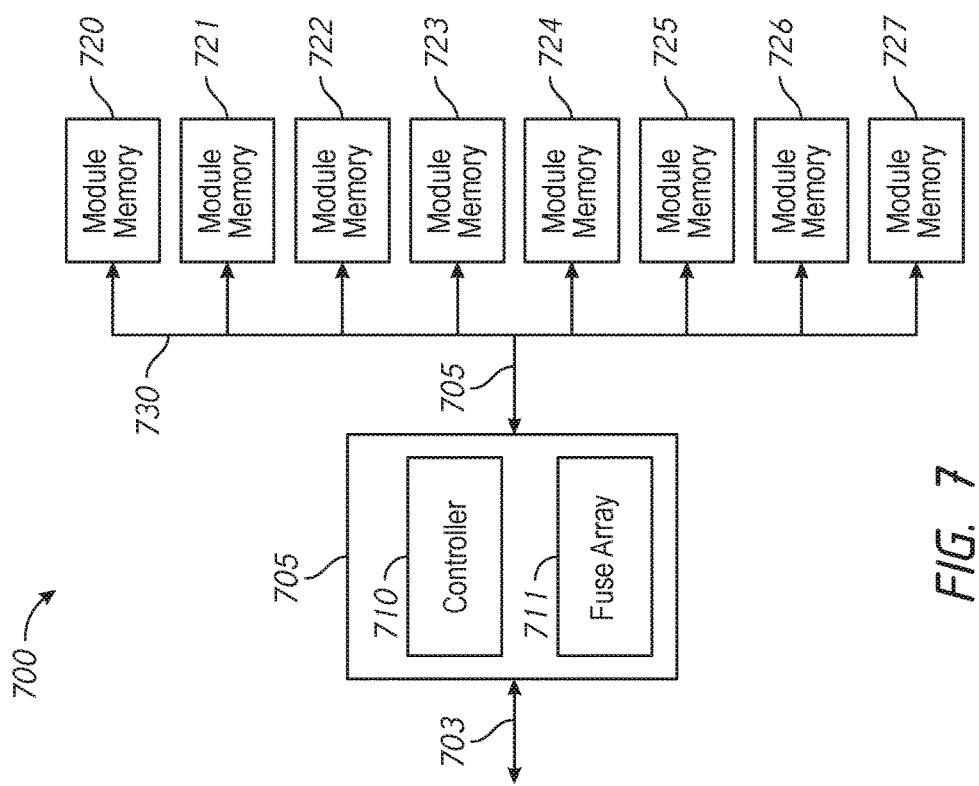
FIG. 7 is a block diagram of an embodiment of a memory system according to an embodiment of the disclosure.

FIG. 7 is a block diagram of an embodiment of a memory system 700 according to an embodiment of the disclosure. The memory system 700 may be coupled to a host (e.g., central process unit (CPU)) over a bi-directional data link. The bi-directional data link can include a serialize/deserialize (SERDES) data link or a parallel data link.

In an embodiment of the disclosure, the memory system 700 may be a hybrid memory cube (HMC). A HMC is a memory system that may be implemented so that memory may be placed on the same substrate as a controller enabling the memory system to perform its intended task more optimally. The HMC may provide memory density to be tightly coupled to a processor. The HMC may include a stack of individual semiconductor devices (e.g., memory devices) connected by internal vertical conductors, such as through-silicon vias (TSVs). TSVs are vertical conductors that can electrically connect a stack of individual memory dies with the controller. The HMC can provide a smaller form factor, deliver bandwidth and efficiencies while using less energy to transfer data per bit. In an embodiment of the disclosure, the controller includes a high-speed logic layer that interfaces with the vertical stacks of memory devices that are connected using the TSVs. The memory can handle the data, while the logic layer can handle memory control within the HMC.

The memory system 700 includes a controller 710 such as a controller 710 implemented in either an application specific integrated circuit (ASIC) or a field programmable gate array (FPGA). The ASIC/FPGA can include other logic blocks corresponding to memory control and communication with a host. The ASIC/FPGA can be used to enable customization for a particular use or be a processor (CPU). The controller 710 can include a processor (CPU), an ASIC, or other controlling circuitry. Subsequent reference to the controller 710 may include the ASIC/FPGA. A fuse array 711 may be programmed to store repair information according to an embodiment of the present disclosure. The fuse array 711 may be implemented as the fuse array 110 of FIG. 1A in some embodiments of the disclosure. The controller 710 and the fuse array 711 may be integrated into a semiconductor die 705. The controller 710 may communicate externally through a communication bus 703, for example, with a host coupled to the communication bus 703.

The memory system 700 additionally includes a plurality of semiconductor devices 720-727. One or more of the semiconductor devices 720-727 may be a memory device. The semiconductor devices 720-727 may be interchangeably referred to as memory devices. The semiconductor devices 720-727 can be in the form of stacked semiconductor dies. The semiconductor devices 720-727 may be any type of memory device including, but not limited to, volatile memory (e.g., dynamic random access memory (DRAM), static random access memory (SRAM)) or non-volatile memory (e.g., Flash, phase change memory (PCM)). The semiconductor devices 720-727 shown in FIG. 7 may include an additional layer for signal organization and/or buffering as part of a stack.

The semiconductor devices 720-727 can include any input/output (I/O) circuitry typically associated with memory devices in order for each semiconductor device 720-727 to communicate with the controller 710 over a memory bus 730. Thus, the controller 710 can write data for storage to a particular semiconductor device 720-727 over the memory bus 730 and that particular semiconductor device use its associated I/O circuitry to accept the data and store it in the semiconductor device. Similarly, the controller 710 can read data from a particular semiconductor device 720-727 and the I/O circuitry of the particular semiconductor device 720-727 can access the memory array to retrieve the addressed memory location(s). The semiconductor devices 720-27 may each include repair address and repair flag loading circuits and further include repair planes according to an embodiment of the disclosure. For example, the repair planes 140 may be included in the semiconductor devices 720-727 in an embodiment of the disclosure.

The controller 710 may include a repair decode logic and control circuit that reads the repair information from the fuse array 711 and provides control signals and repair addresses to the semiconductor devices 720-727 over the memory bus 730. The control signals and repair address may be provided over a JTAG bus included in the memory bus 730. The JTAG bus may be coupled to a JTAG interface included in the controller 710 and JTAG communication circuits included in the semiconductor devices 720-727. The repair decode logic and control circuit of the controller 710 may read the repair information and provide intermediate repair information to JTAG communication circuits over the memory bus 730, thus, providing memory repair information to each of the semiconductor devices 720-727. The JTAG communication circuits of the semiconductor devices 720-27 receive the intermediate repair information and provide repair address and repair flag sets to the repair planes of each of the semiconductor devices 720-727 to repair memory locations.

The memory system 700 may include a memory repair system according to an embodiment of the disclosure. For example, the memory system 700 may include a memory repair system such as memory repair system 100 of FIG. 1A. The fuse array 110 may be implemented as the fuse array 711 of the control 710 and the repair planes 140 may be implemented in the semiconductor devices 720-727. A portion of the repair and decode logic and control circuit 120 may be included in the controller 710 and another portion of the repair and decode logic and control circuit 120 may be included in the semiconductor devices 720-727 to provide repair address and repair flag sets to the repair planes of the semiconductor devices 702-727.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a fuse array configured to store repair information, wherein the repair information includes repair commands and load repair addresses, wherein the load repair addresses include a respective repair address;
   a first repair plane including a block of memory and repair logic, the block of memory including a plurality of redundant memory and the repair logic including a plurality of repair blocks, each repair block of the plurality of repair blocks associated with a respective one of the plurality of redundant memory and each repair block of the plurality of repair blocks configured to store a repair address;
   a second repair plane including a block of memory and repair logic, the block of memory of the second repair plane including a plurality of redundant memory and the repair logic including a plurality of repair blocks, each repair block of the plurality of repair blocks associated with a respective one of the plurality of redundant memory and each repair block of the plurality of repair blocks configured to store a repair address; and
   a decode logic and control circuit configured to read the repair information and decode the repair commands, and configured to load repair addresses into the plurality of repair blocks based at least in part on the decoded repair commands, the decode logic and control circuit is further configured to transfer a repair plane token from the first repair plane to the second repair plane responsive to a repair command to transfer the repair plane token to a next repair plane.

2. The apparatus of claim 1 wherein the load repair addresses includes a compressed repair address.

3. The apparatus of claim 2 wherein the decode logic and control circuit is configured to uncompress the compressed repair address and load the uncompressed repair address into a repair block.

4. The apparatus of claim 3 wherein the decode logic and control circuit is configured to uncompress a compressed repair address that is a "0" and load all zeros into the repair block.

5. The apparatus of claim 3 wherein the decode logic and control circuit is configured to interpret and execute the decoded repair commands.

6. The apparatus of claim 1 wherein the fuse array, first repair plane, and decode logic and control circuit are integrated into a semiconductor device.

7. The apparatus of claim 1 wherein the decode logic and control circuit is configured to load repair addresses into the plurality of repair blocks of the second repair plane following the transfer of the repair plane token to the second repair plane.

8. The apparatus of claim 1 wherein the decode logic and control circuit is configured to identify a repair command by a repair command prefix and to identify a load repair address by a load repair address prefix.

9. The apparatus of claim 8 wherein the decode logic and control circuit is configured to decode a command code following the repair command prefix for a repair command and to load a repair address following the load repair address prefix for a load repair address.

10. An apparatus, comprising:
    a fuse array configured to store repair information;
    a memory bus;
    a controller coupled to the memory bus, the controller including a decode logic and control circuit, the decode logic and control circuit configured to read the repair information and translate the repair information into intermediate repair information and providing the intermediate repair information to the memory bus; and
    a plurality of memory devices coupled to the memory bus, each memory device of the plurality of memory devices including:
       primary memory and redundant memory;
       repair logic including a plurality of repair blocks, each repair block of the plurality of repair blocks configured to store a repair flag and a repair address that is mapped to a respective redundant memory unit of the redundant memory; and
       repair address and repair flag loading circuits configured to receive the intermediate repair information from the memory bus and further configured to load a repair address and repair flag set into a repair block of the plurality of repair blocks, wherein the repair address and repair flag set is based at least in part on the intermediate repair information.

11. The apparatus of claim 10 wherein the memory bus includes a Joint Test Action Group (JTAG) communication channel.

12. The apparatus of claim 11 wherein the controller is configured to translate the repair information into intermediate repair information including repair information chains meeting the protocol for the JTAG communication channel.

13. The apparatus of claim 10 wherein the fuse array and the controller are integrated in a semiconductor die and wherein the plurality of memory devices are stacked memory devices.

14. The apparatus of claim 10 wherein the repair information stored in the fuse array includes repair commands and load repair addresses, wherein the load repair addresses includes at least one compressed repair address.

15. The apparatus of claim 14 wherein the repair information includes repair commands and load repair addresses, wherein the repair commands each include a repair command prefix and command code and wherein at a load repair address includes a load repair address prefix and a repair address.

* * * * *